(12) United States Patent
Lee et al.

(10) Patent No.: US 10,867,843 B2
(45) Date of Patent: Dec. 15, 2020

(54) METHOD AND SYSTEM FOR FABRICATION SEMICONDUCTOR DEVICE

(71) Applicant: TAIWAN SEMICONDUCTOR MANUFACTURING CO., LTD., Hsinchu (TW)

(72) Inventors: Shao-Kuan Lee, Kaohsiung (TW); Hsin-Yen Huang, New Taipei (TW); Hai-Ching Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/426,226

(22) Filed: Feb. 7, 2017

(65) Prior Publication Data

US 2018/0158725 A1    Jun. 7, 2018

Related U.S. Application Data

(60) Provisional application No. 62/429,964, filed on Dec. 5, 2016.

(51) Int. Cl.
| | |
|---|---|
| *H01L 21/768* | (2006.01) |
| *H01L 21/311* | (2006.01) |
| *H01L 21/02* | (2006.01) |
| *H01J 37/32* | (2006.01) |

(Continued)

(52) U.S. Cl.
CPC ...... *H01L 21/76825* (2013.01); *B08B 7/0057* (2013.01); *H01J 37/32009* (2013.01); *H01J 37/3244* (2013.01); *H01J 37/32853* (2013.01); *H01L 21/02063* (2013.01); *H01L 21/31116* (2013.01); *H01L 21/76814* (2013.01); *H01L 21/76826* (2013.01); *H01J 2237/334* (2013.01);

(Continued)

(58) Field of Classification Search
CPC .......... H01J 37/32009; H01J 37/32853; H01J 37/3244; H01J 2237/334; B08B 7/0057; H01L 21/76825; H01L 21/02063; H01L 21/67028; H01L 21/67115
See application file for complete search history.

(56) References Cited

U.S. PATENT DOCUMENTS

| | | | | |
|---|---|---|---|---|
| 6,043,165 A * | 3/2000 | Park | ................. | H01L 21/31055 257/E21.245 |
| 6,124,211 A * | 9/2000 | Butterbaugh | ......... | B08B 7/0057 134/1 |

(Continued)

*Primary Examiner* — Savitri Mulpuri
(74) *Attorney, Agent, or Firm* — McClure, Qualey & Rodack, LLP

(57) ABSTRACT

A method for fabrication a semiconductor device and a system utilizing the same are provided. In the method for fabrication the semiconductor device, at first, a semiconductor structure having a metal conducting structure is provided. Next, a dielectric layer is deposited over the metal conducting structure. Then, an etching process is performed on the dielectric layer by using a fluorine-containing gas so as to form an opening, in which fluorine-containing compounds are formed on a surface of the opening during the etching process. And then, a pre-cleaning process is performed by using UV radiation so as to remove the fluorine-containing compounds. After the pre-cleaning process is performed, a cleaning process is performed to clean the surface of the opening.

20 Claims, 8 Drawing Sheets

(51) Int. Cl.
    *B08B 7/00*     (2006.01)
    *H01L 21/67*     (2006.01)

(52) U.S. Cl.
    CPC ... *H01L 21/67028* (2013.01); *H01L 21/67115* (2013.01)

(56) References Cited

U.S. PATENT DOCUMENTS

| | | | | |
|---|---|---|---|---|
| 6,204,168 B1* | 3/2001 | Naik | | H01L 21/31144 257/E21.257 |
| 6,451,647 B1* | 9/2002 | Yang | | H01L 21/28123 257/310 |
| 6,528,409 B1* | 3/2003 | Lopatin | | H01L 21/288 257/E21.174 |
| 6,664,636 B2* | 12/2003 | Pyo | | H01L 21/67167 257/762 |
| 6,677,679 B1* | 1/2004 | You | | H01L 21/76802 257/758 |
| 6,831,003 B1* | 12/2004 | Huang | | H01L 21/76843 257/E21.581 |
| 7,030,012 B2* | 4/2006 | Divakaruni | | H01L 27/10894 438/241 |
| 7,208,418 B1* | 4/2007 | Okada | | H01L 21/76831 257/E21.579 |
| 7,244,683 B2* | 7/2007 | Chung | | C23C 16/34 257/E21.17 |
| 7,655,081 B2* | 2/2010 | Dai | | C23C 18/1844 106/1.22 |
| 8,021,514 B2* | 9/2011 | Fu | | H01J 37/32357 156/345.33 |
| 8,171,627 B2* | 5/2012 | Hance | | H01L 21/76802 29/825 |
| 8,445,382 B2* | 5/2013 | Besling | | H01L 21/76808 257/632 |
| 8,492,287 B2* | 7/2013 | Tahara | | H01L 21/02063 216/58 |
| 8,501,626 B2* | 8/2013 | Liu | | H01L 21/28282 216/41 |
| 8,747,686 B2* | 6/2014 | Zheng | | C23C 14/54 156/345.25 |
| 8,808,564 B2* | 8/2014 | Rogers | | H01L 27/11521 216/37 |
| 8,821,985 B2* | 9/2014 | Shao | | C23C 16/04 427/532 |
| 9,299,557 B2* | 3/2016 | Tolle | | H01L 21/02301 |
| 9,390,970 B2* | 7/2016 | Chiang | | C23C 14/046 |
| 9,474,163 B2* | 10/2016 | Tolle | | H01L 21/02041 |
| 9,653,327 B2* | 5/2017 | Lee | | C23C 16/0245 |
| 9,865,887 B2* | 1/2018 | Mair | | H01M 8/02 |
| 10,121,698 B2* | 11/2018 | Lee | | H01L 21/02057 |
| 2002/0155700 A1* | 10/2002 | Chen | | H01L 21/76831 438/639 |
| 2005/0020093 A1* | 1/2005 | Ahn | | H01L 21/02063 438/782 |
| 2006/0172552 A1* | 8/2006 | Ajmera | | H01L 21/31695 438/778 |
| 2007/0272359 A1* | 11/2007 | Kawaguchi | | H01L 21/02071 156/345.32 |
| 2008/0064214 A1* | 3/2008 | Han | | H01L 21/3105 438/702 |
| 2008/0099040 A1* | 5/2008 | Bahng | | H01L 21/02057 134/1.3 |
| 2008/0254619 A1* | 10/2008 | Lin | | H01L 21/02063 438/675 |
| 2014/0353835 A1* | 12/2014 | Chae | | H01L 21/76843 257/773 |
| 2016/0056071 A1* | 2/2016 | Draeger | | H01L 23/53238 438/653 |

* cited by examiner

METHOD AND SYSTEM FOR FABRICATION SEMICONDUCTOR DEVICE

RELATED APPLICATION

This application claims the benefit of the Provisional Application Ser. No. 62/429,964, filed Dec. 5, 2016. The entire disclosures of all the above applications are hereby incorporated by reference herein.

BACKGROUND

In semiconductor technology, an electrical signal is transmitted by interconnect metal lines. An inter-layer dielectric (ILD) layer is used to insulate the interconnect metal lines so as to prevent the interconnect metal lines from having the defects of RC-delay and crosstalk. Further, for forming anticipated profiles and connections of the interconnect metal lines, a dry etching process is performed on the ILD layer, in which the dry etching process is typically performed by using plasma or ionized gas which is advantageous to anisotropic etching and high selectivity. However, the ionized gas with a higher oxidizing capability is likely to be reacted with etched material, thus inducing leakage defects, further lowering the RC performance of the semiconductor device and deteriorating the breakdown voltage (VBD) and time dependent dielectric breakdown (TDDB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
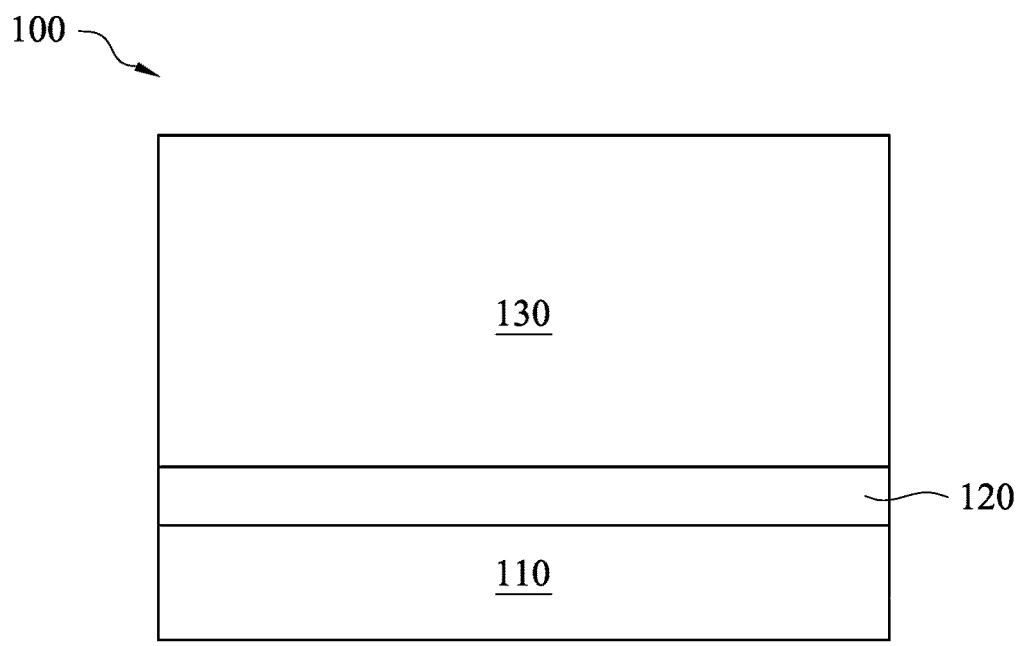
FIG. 1A to FIG. 1G are schematic cross-sectional views of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Typically, during a back end of line (BEOL) process, a low-k dielectric layer is first subjected to a dry etching process for forming interconnecting structures (such as openings, vias, contacts, trenches or the like) in the low-k dielectric layer. Because the dry etching process uses a fluorine-containing gas, fluorine-containing compounds are often formed on etched surfaces. After the dry etching process is performed, a cleaning process with a water-based solution is performed to remove the fluorine-containing compounds. However, because of an affinity between a fluorine atom and a hydrogen atom, the fluorine atom is easily dissociated from the fluorine-containing compounds and bonded with the hydrogen atom of the water-based solution to form hydrofluoric acid. Because the hydrofluoric acid corrodes the surfaces of interconnecting structures, low-k leakage defects are induced.

Embodiments of the present disclosure are directed to a method for fabricating a semiconductor device and a system for fabricating the semiconductor device. The present disclosure provides the method for preventing a semiconductor substrate having a low-k dielectric layer from the damages of the etching process, further dissolving the low-k leakage defects. Following the etching process, the etched semiconductor substrate is further subjected to a pre-cleaning process, thereby removing fluorine-containing compounds produced during the etching process. Therefore, the hydrofluoric acid is not formed during the following cleaning process. Further, the system of the present disclosure combines an etching chamber, a pre-cleaning chamber and a cleaning chamber into one processing apparatus, thereby ensuring a better Q-time control and a higher through put.

Referring to FIG. 1A to FIG. 1E, FIG. 1A to FIG. 1E are schematic cross-sectional views of a semiconductor structure in accordance with some embodiments of the present disclosure. At first, as shown in FIG. 1A, the semiconductor structure 100 includes a first metal conducting structure 110, an etching stop layer (ESL) 120 and an inter-layer dielectric (ILD) layer 130. In some embodiments, the semiconductor structure 100 is disposed over a semiconductor substrate with a gate structure and source/drain features. In this embodiment, the gate structure is disposed on a top surface of the semiconductor substrate, and the source/drain features respectively are formed at opposite sides of the gate structure.

In some embodiments, the semiconductor substrate is a silicon on insulator (SOI) substrate, or a silicon on sapphire (SOS) substrate. In some embodiments, the semiconductor substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the semiconductor substrate includes a doped epitaxial layer, a gradient semiconductor layer, and/or further includes at least one organic material. In at least one embodiment, the semiconductor substrate includes an active region and an isolation region, such as a shallow trench isolation (STI). In this embodiment, the formation of the STI includes a photolithography process, an etch process to form a trench in the substrate, and a deposition process to fill in the trench with one or more dielectric materials.

In some embodiments, the gate structure includes polysilicon, a metallic compound, a conductive alloy, a conductive polymer or another suitable gate material. In some embodiments, the gate structure is formed by a procedure including deposition, photolithography, and etch processes. In this embodiment, the deposition process includes chemical vapor deposition (CVD), physical vapor deposition (PVD), atomic layer deposition (ALD), other suitable processes and/or a combination thereof. In this embodiment, the photolithography process includes photoresist coating, soft baking, mask aligning, exposure, post-exposure baking, developing the photoresist, rinsing, and drying. In this embodiment, the etch process includes wet etching, dry etching and/or other etching methods.

In some embodiments, the source/drain features are from by an epi process. In some embodiments, the source/drain features include epitaxially grown silicon (epi Si), silicon carbide or silicon germanium. In some embodiments, the source/drain features are in-situ doped or undoped during the epi process. In some embodiments, when the source/drain features are undoped during the epi process, the source/drain features are doped during a subsequent process. The subsequent doping process is achieved by an ion implantation, plasma immersion ion implantation, gas and/or solid source diffusion, other suitable processes and/or a combination thereof. In some embodiments, the source/drain features are further exposed to annealing processes after forming the source/drain features and/or after the subsequent doping process.

In some embodiments, the gate structure is insulated by a dielectric layer. In this embodiment, the dielectric layer fills in a gap between the gate structure and adjacent gate structures. In some embodiments, the dielectric layer includes a silane-based insulating material such as silicon oxide, silicon nitride, undoped silicate glass (USG), Boro-Silicate Glass (BSG), TEOS, other suitable silane-based materials and/or a combination thereof.

Further, the dielectric layer is etched until to the source/drain features, thereby forming a channel. In some embodiments, a first conducting metal is deposited into the channel so as to form the first metal conducting structure 110 (FIG. 1A). In some embodiments, the first conducting metal includes copper, tungsten, silicide, other suitable conducting metal and/or a combination thereof. In some embodiments, the first metal conducting structure 110 includes various interconnecting structures, such as vias, contacts, pads, metal lines, other suitable interconnects and/or a combination thereof.

As shown in FIG. 1A. The ESL 120 is deposited over the first metal conducting structure 110. In some embodiments, the ESL 120 includes a same material as spacers in the gate structure. In some embodiments, the ESL 120 includes a different material from the spacers in the gate structure. In some embodiments, examples of materials which are used to form the ESL 120 include silicon nitride, silicon oxide, silicon oxynitride, silicon carbide, other suitable materials and/or a combination thereof. In some embodiments, the ESL 120 is formed by plasma enhanced chemical vapor deposition (PECVD) process, subatmospheric chemical vapor deposition (SACVD) process, low pressure chemical vapor deposition (LPCVD) process, plasma impulse chemical vapor deposition (PICVD) process, PVD process, ALD process, plasma enhanced atomic layer deposition (PEALD) process, molecular layer deposition (MLD) process, other suitable processes and/or a combination thereof.

The ILD layer 130 is deposited over the ESL 120. In some embodiments, the ILD layer 130 includes a silane-based insulating material such as silicon oxide, silicon nitride, USG, BSG, TEOS, other suitable low-k silane-based materials and/or a combination thereof. In some embodiments, the ILD layer 130 is formed from the low-k material. In some embodiments, the ILD layer 130 is deposited by CVD process, PVD process, ALD process, high density plasma (HDP) process, spin-on-dielectric process, other suitable processes and/or a combination thereof.

Figure 1B:
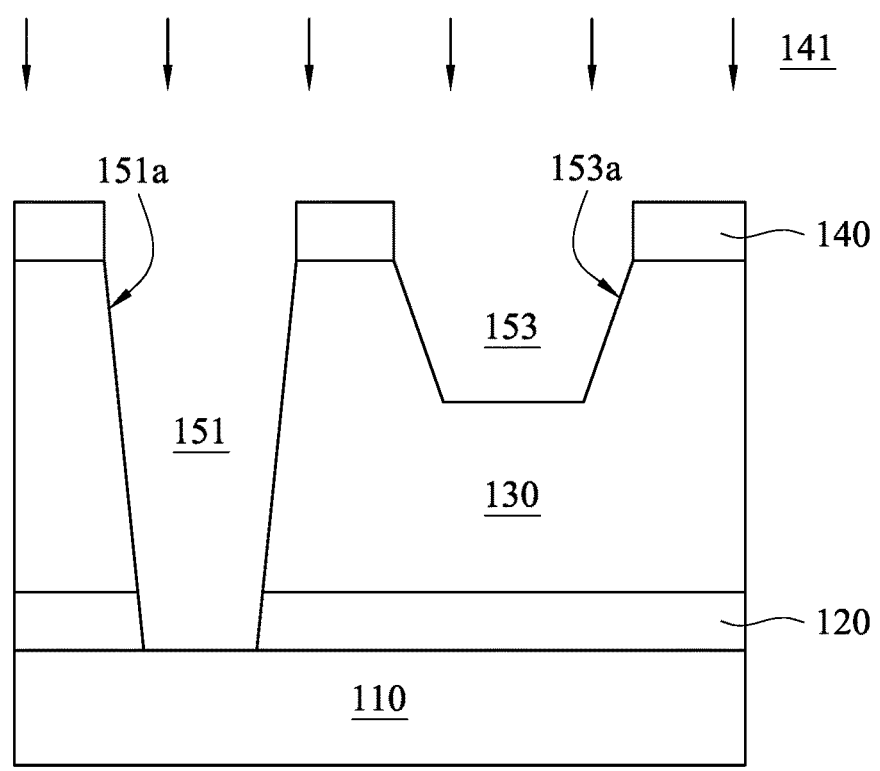

As shown in FIG. 1B. A hard mask 140 is covered onto the ILD layer 130. The hard mask 140 is patterned to form an anticipative pattern by performing a photolithography process, such that a portion of a top surface of the ILD layer 130 is exposed. The exposed top surface of the ILD layer 130 is subjected to an etching process by using a fluorine-containing gas 141. The fluorine-containing gas 141 is used to bombard the exposed top surface of the ILD layer 130 so as to form various interconnecting structures (i.e. a second channel 151 and/or a via 153) in the ILD layer 130. In some embodiments, the various interconnecting structures, such as openings, vias, contacts, pads, trenches, other suitable interconnecting structures and/or a combination thereof, are formed after the ILD layer 130 is bombarded by the fluorine-containing gas 141.

In this embodiment, plural pores are formed in an etched surface 151a of the second channel 151 and in a surface 153a of the via 153 when the exposed top surface of the ILD layer 130 is bombarded by the fluorine-containing gas 141. In this embodiment, fluorine-containing compounds are formed in the surface pores of the second channel 151 and formed in the surface pores of the via 153 during the etching process. For example, the silane-based ILD layer 130 has a chemical bonding "SiOCH" in some embodiments. After the exposed top surface of the ILD layer 130 is bombarded by the fluorine-contain gas 141, the chemical bonding of the ILD layer 130 is reacted with the supplied fluorine-containing gas 141 and transferred to SiO/SiF. In some embodiments, the hard mask 140 is removed after the etching process is performed. In some embodiments, the fluorine-containing gas 141 includes $C_xF_{2x+2}$ ($1 \le x \le 3$), hydrogen fluoride gas, other suitable fluorine-containing gases and/or a combination thereof. For example, the fluorine-containing gas 141 includes $CF_4$, $C_4F_6$, $C_4F_8$, $CHF_3$, $CH_2F_2$, $CH_3F$ and/or a combination thereof.

Figure 1C:
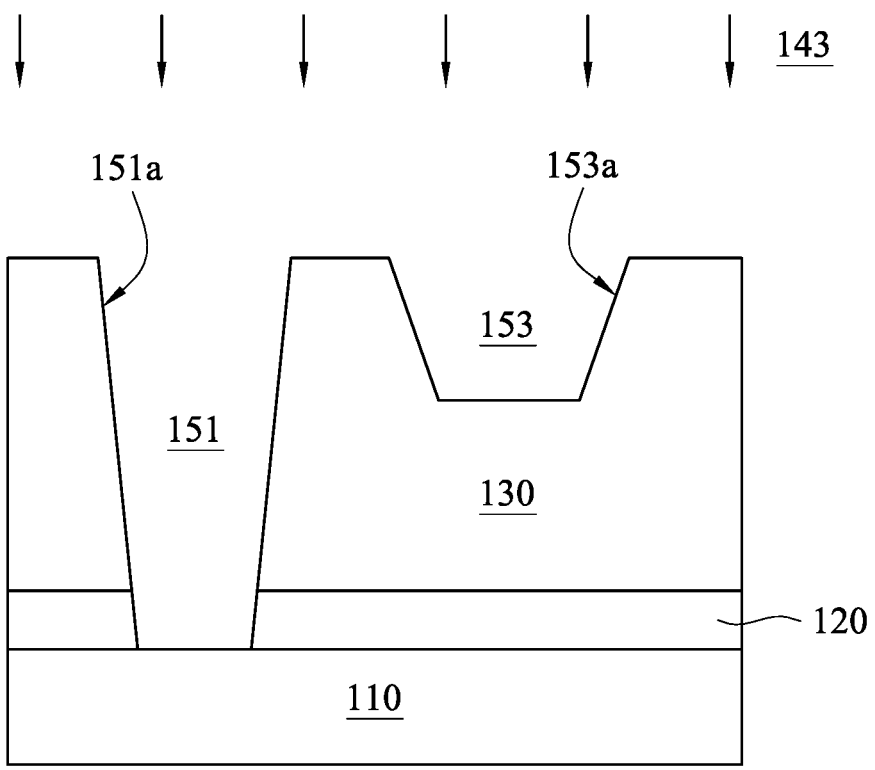

As shown in FIG. 1C. The ILD layer 130 is subjected to a pre-cleaning process by illumination UV radiation 143. The fluorine-containing compounds formed in the surface pores of the second channel 151 and the via 153 are degraded by the illumination of the UV radiation 143. In some embodiments, a wavelength of the UV radiation 143 is in a range substantially from 200 nm to 250 nm. In some embodiments, the wavelength of the UV radiation 143 covers an absorption wavelength of the fluorine-containing compounds. In some embodiments, the wavelength of the UV radiation 143 covers an absorption wavelength of the chemical bonding Si—F. In some embodiments, an illuminating period of the UV radiation 143 is substantially at least 30 seconds. In some embodiments, the illuminating period of the UV radiation 143 is in a range substantially from 30 seconds to 120 seconds. When the illuminating period of the UV radiation is too long, low-k leakage defects of the ILD layer 130 is induced by the UV radiation 143, such that defects of carbon depletion are induced during a following integrating process. When the illuminating period of the UV radiation 143 is too short, the fluorine-containing compounds are not completely degraded by the UV radiation 143. The residual fluorine-containing compounds cause damages to the ILD layer 130 in a following cleaning process. In some embodiments, the illuminating period of the UV radiation 143 is adjustable based on a content of the remaining fluorine in the surface pores of the second channel 151 and the surface pores of the via 153. For example, the content of the fluorine on the etched ILD layer 130 is substantially 10%. After the UV radiation 143 is illuminated, the content of the fluorine on the etched ILD layer 130 decreases less than 5%. In some embodiments, the content of the fluorine on the etched ILD layer 130 substantially decreases to 0%.

Figure 1D:
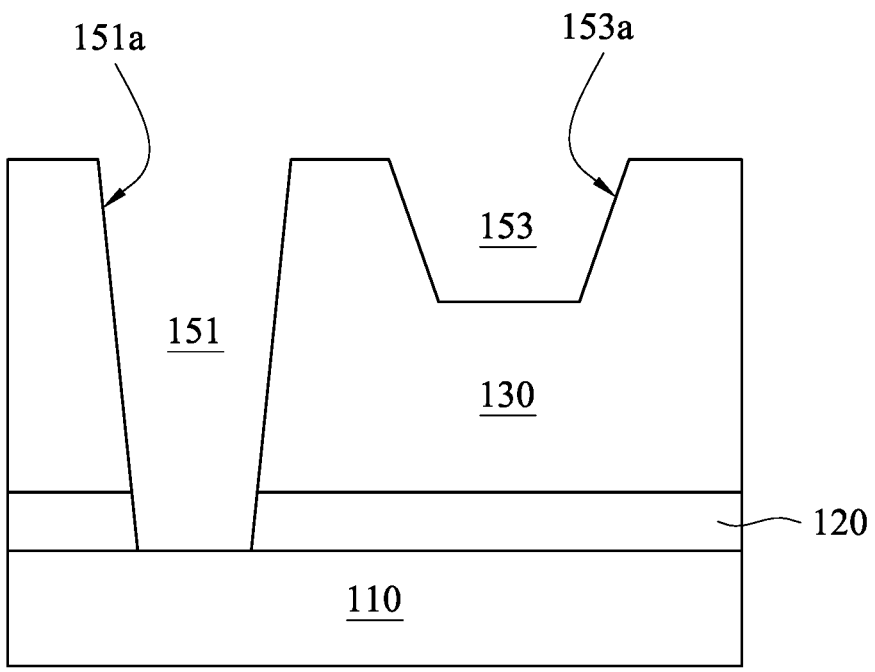

As shown in FIG. 1D. The semiconductor structure is subjected to a cleaning process. In some embodiments, the semiconductor structure is cleaned by using a water-based solution during the cleaning process. In some embodiments, the water-based solution includes deionized water. In the embodiment, undesired residual compounds produced during the etching process and the pre-cleaning process are removed by the water-based solution. During the cleaning process, because the fluorine-containing compounds are degraded by the UV radiation 143 (FIG. 1C), the surface pores do not become larger. If the fluorine-containing compounds were not completely or almost degraded during the pre-cleaning process, the residual fluorine atoms are easily dissociated from the residual fluorine-containing compounds and bonds with hydrogen atoms of the water-based solution so as to form hydrofluoric acid solution. Thus, the surface pores in the surface 151a of the second channel 151 and the surface pores in the surface 153a of the via 153 are corroded by the hydrofluoric acid solution, such that the surface pores are enlarged so as to induce the defects of low-k leakage and carbon depletion during a following integrating process.

Figure 1E:
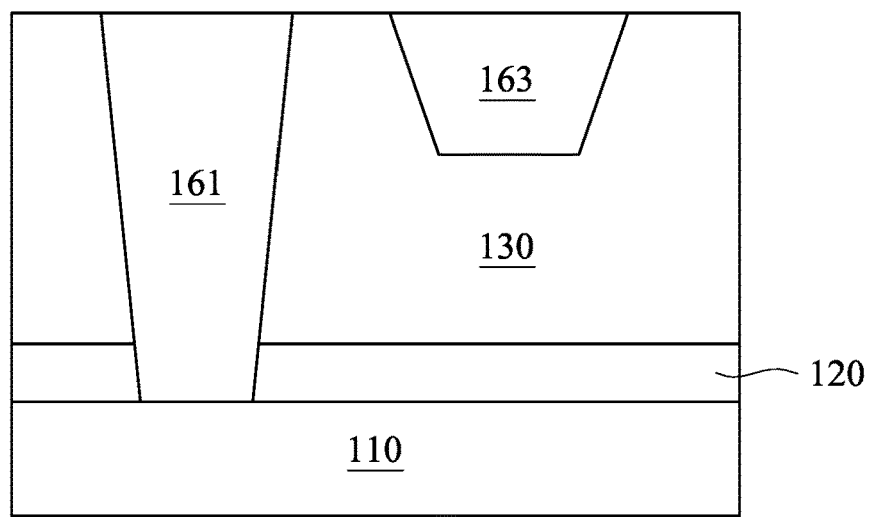

As shown in FIG. 1D and FIG. 1E. A second conducting metal is deposited into the channel 151 and the via 153 so as to form a metal conducting channel 161 and a metal conducting via 163. In some embodiments, the second conducting metal includes a same material as the first conducting metal. In some embodiments, the second conducting metal includes a different material from the first conducting metal. In some embodiments, the second conducting metal includes copper, tungsten, silicide, other suitable conducting metal and/or a combination thereof.

Referring to FIG. 1C together with FIG. 1D and FIG. 1E. In some embodiments, the surface pores of the second channel 151 and the surface pores of the via 153 are further filled with a precursor after the pre-cleaning process is performed. In some embodiments, the precursor includes a low-k material used to deposit ILD layer 130. In other words, the precursor includes a same material as the ILD layer 130. In some embodiments, the precursor includes a low-k silane-based material. In some embodiments, the low-k silane based material includes silicon oxide, silicon nitride, TEOS, other suitable low-k silane based materials and/or a combination thereof. During the filling process of the precursor, the precursor is deposited to fill the surface pores in the surface 151a and the surface pores in the surface 153a rather than forming a layer over the surface 151a and the surface 153a. In some embodiments, a thickness of the deposited precursor is substantially less than 10 Å. In this embodiment, the precursor further prevents the surface pores in the first surface 151a and in the surface 153a from the damages of the residual fluorine-containing compounds. If the deposited precursor formed a thin layer over the surface 151a and/or the surface 153a, a profile of the semiconductor structure is varied by the thin layer formed from the precursor.

Further, the semiconductor structure is cleaned by the water-based solution after the surface pores in the surface 151a and in the surface 153a are filled with the precursor. The second conducting metal is deposited into the second channel 151 and the via 153 so as to form the metal conducting channel 161 and the metal conducting via 163.

Figure 1F:
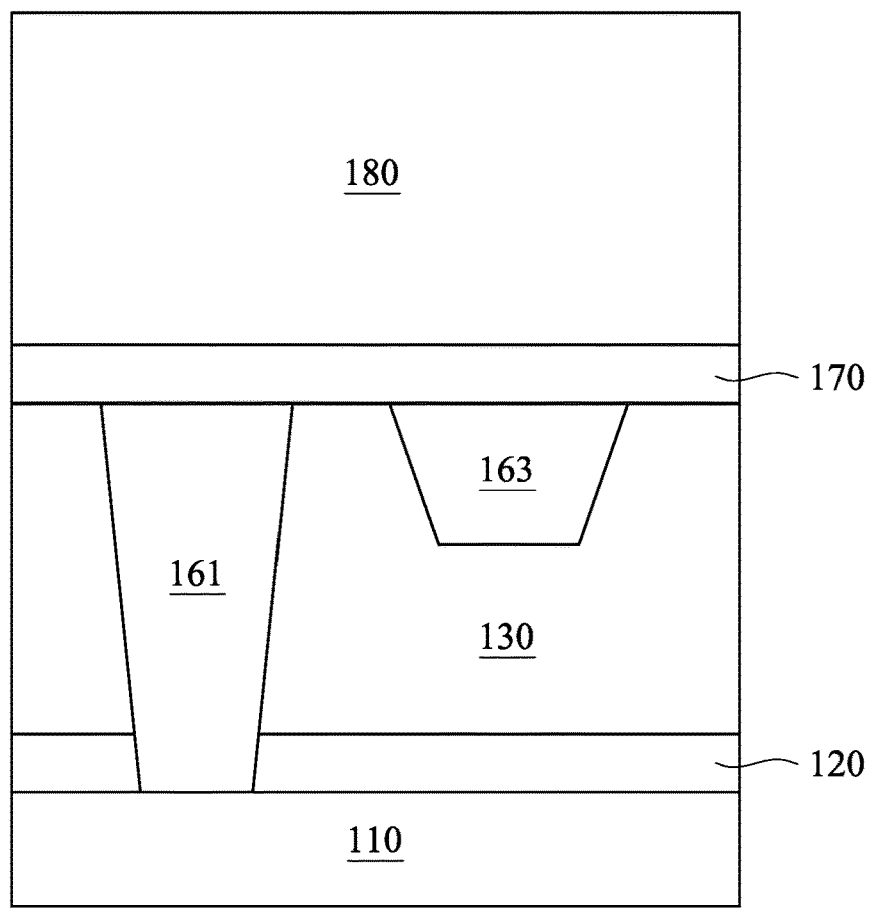
Figure 1G:
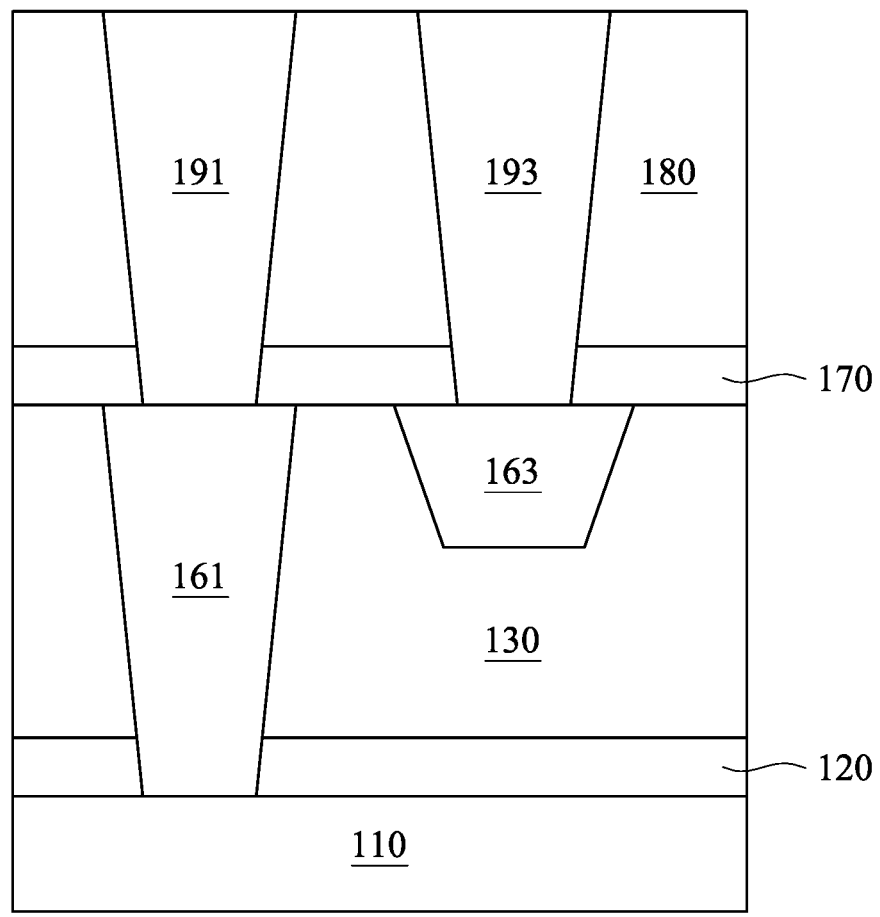

Referring to FIG. 1F and FIG. 1G, FIG. 1F and FIG. 1G are schematic cross-sectional views of a semiconductor structure in accordance with some embodiments of the present disclosure. As shown in FIG. 1F. The semiconductor structure further includes another ILD layer 180 and ESL 170 covered by the ILD layer 180. The ESL 170 is deposited over the ILD layer 130, the metal conducting channel 161 and the metal conducting via 163. In some embodiments, the ESL 170 includes a same material as the ESL 120. In some embodiments, the ESL 170 includes a different material from the ESL 120. Similarly, the ILD layer 180 includes a same material as the ILD layer 130 in some embodiments. In some embodiments, the ILD layer 180 includes a different material from the ILD layer 130. In some embodiments, the ESL 170 and the ILD layer 180 are formed by the same processes as the ESL 120 and the ILD layer 130.

As shown in FIG. 1G. The semiconductor substrate is sequentially subjected to the etching process, the pre-cleaning process and the cleaning process so as to form various interconnecting structures. Further, a metal conducting channel 191 and a metal conducting channel 193 are disposed into the interconnecting structures in the ILD layer 180, thereby forming metal conducting channels 191 and 193. The metal conducting channels 191 and 193 are formed from a third conducting metal. In some embodiments, the third conducting metal includes a same material as the second conducting metal. Similarly, the pre-cleaning process prevents the metal conducting channels 191 and 193 from having the low-k leakage defects due to the degradation of the fluorine-containing compounds with the illumination of the UV radiation.

Figure 2:
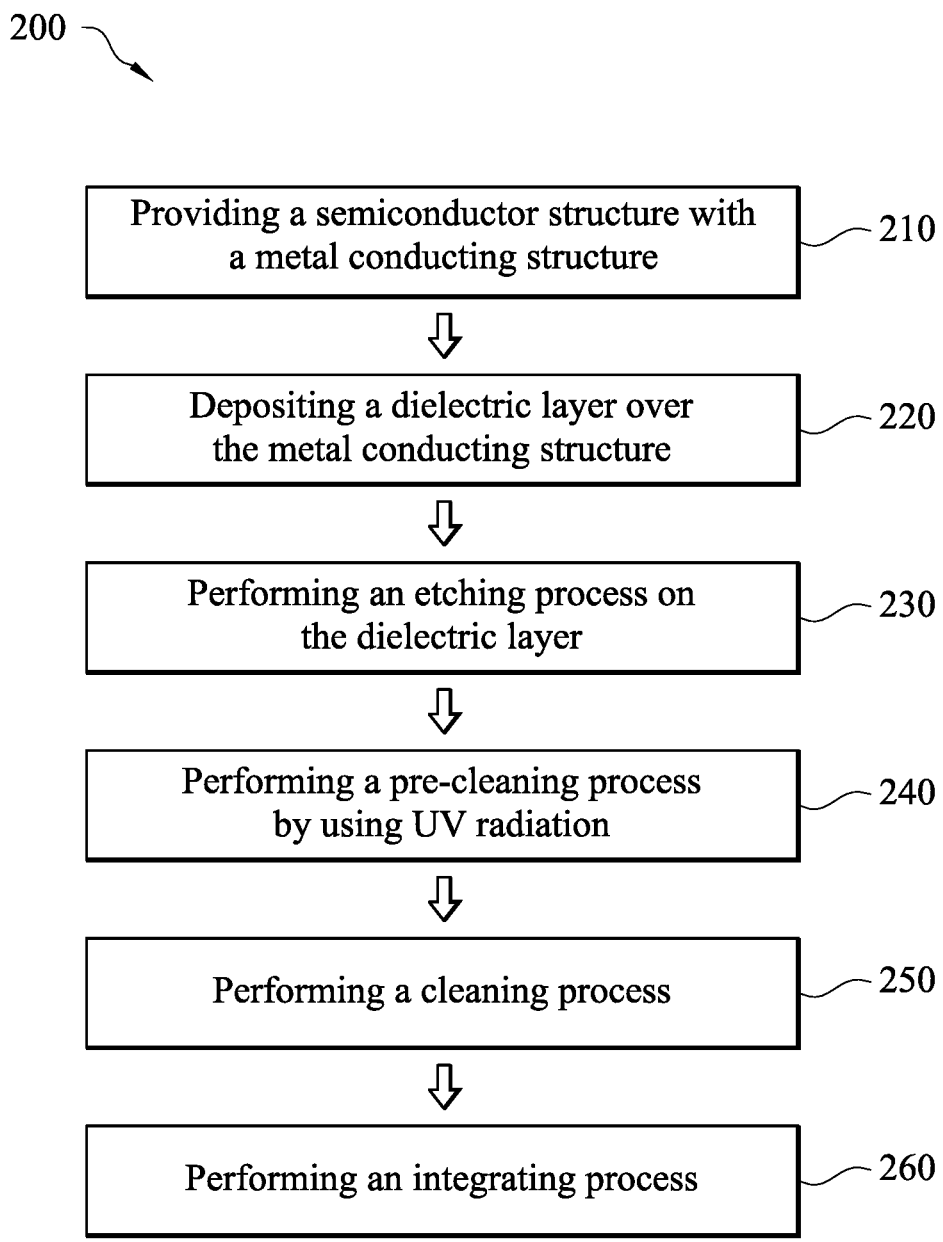
FIG. 2 is a flow chart showing a method for fabrication a semiconductor device according to some embodiments of the present disclosure.

Referring to FIG. 2 and FIG. 1A to FIG. 1E. FIG. 2 is a flow chart showing a method 200 for fabrication a semiconductor device according to some embodiments of the present disclosure.

At operation 210, a semiconductor structure 100 with a metal conducting structure 110 is provided. In some embodiments, the semiconductor structure 100 is disposed over a semiconductor substrate with a gate structure and source/drain features. In this embodiment, the gate structure is disposed on a top surface of the semiconductor substrate, and the source/drain features respectively are formed at opposite sides of the gate structure. In the semiconductor structure 100, the conducting metal is deposited into the interconnecting structures so as to form the metal conducting structure 110.

At operation 220. An ILD layer 130 is deposited over the metal conducting structure 110, as shown in FIG. 1A. In some embodiments, the ILD layer 130 includes a silane-based insulating material such as silicon oxide, silicon nitride, USG, BSG, TEOS, other suitable low-k silane-based materials and/or a combination thereof. In some embodiments, the ILD layer 130 is formed from the low-k material. In some embodiments, an ESL 120 is deposited between the first metal conducting structure 110 and the ILD layer 130. In some embodiments, examples of materials which are used to form the ESL 120 include silicon nitride, silicon oxide, silicon oxynitride, silicon carbide, other suitable materials and/or a combination thereof.

At operation 230. An etching process is performed on the ILD layer 130 by using a fluorine-containing gas 141, as shown in FIG. 1B. In this embodiment, a hard mask 140 with an anticipative pattern covers the ILD layer 130 so as to expose a portion of a top surface of the ILD layer 130. The fluorine-containing gas 141 is supplied to bombard the exposed top surface of the ILD layer 350 so as to form an opening (interconnecting structure, i.e. a second channel 151 and/or a via 153) in the ILD layer 130. In some embodiments, various interconnecting structures, such as vias, contacts, pads, metal lines, other suitable interconnects and/or a combination thereof, are formed after the ILD layer 130 is bombarded by the fluorine-containing gas 141.

In some embodiments, plural pores are formed in a surface 151a of the channel 151 and in a surface 153a of the via 153 when the exposed top surface of the ILD layer 130 is bombarded by the fluorine-containing gas 141. In this embodiment, fluorine-containing compounds are formed in the surface pores of the channel 151 and the surface pores of the via 153. In some embodiments, the fluorine-containing gas 141 includes $C_xF_{2x+2}$ ($1 \leq x \leq 2$), hydrogen fluoride gas, other suitable fluorine-containing gases and/or a combination thereof. For example, the fluorine-containing gas 141 includes $CF_4$, $C_4F_6$, $C_4F_8$, $CHF_3$, $CH_2F_2$, $CH_3F$ and/or a combination thereof.

At operation 240. A pre-cleaning process is performed to the etched semiconductor structure by using UV radiation 143, as shown in FIG. 1C. In this embodiment, the fluorine-containing compounds formed in the surface pores of the channel 151 and the surface pores of the via 153 are degraded by the illumination of the UV radiation 143. In some embodiments, a wavelength of the UV radiation 143 is in a range substantially from 200 nm to 250 nm. In some embodiments, the wavelength of the UV radiation 143 covers an absorption wavelength of the fluorine-containing compounds, for example 200 nm to 250 nm. In some embodiments, the wavelength of the UV radiation 143 covers an absorption wavelength of the chemical bonding Si—F. In some embodiments, an illuminating period of the UV radiation 143 is substantially at least 30 seconds. In some embodiments, the illuminating period of the UV radiation 143 is in a range substantially from 30 seconds to 120 seconds. When the illuminating period of the UV radiation 143 is too long, low-k leakage defects of the ILD layer 130 are induced by the UV radiation 143 so as to causing the defects of carbon depletion during a following integrating process. When the illuminating period of the UV radiation 143 is too short, the fluorine-containing compounds are not completely degraded by the UV radiation 143 so as to cause damages to the ILD layer 130 in a following cleaning process. In some embodiments, an illuminating period of the UV radiation 143 is adjustable based on a content of the remaining fluorine in the surface pores of the channel 151 and the surface pores of the via 153.

At operation 250. A cleaning process is performed to the semiconductor structure by using a water-based solution, as shown in FIG. 1D. Undesired residual compounds produced during the etching process and the pre-cleaning process are removed by the water-based solution. In some embodiments, the water-based solution includes deionized water. In some embodiments, the hydrofluoric acid solution does not exist during the cleaning process due to the degradations of the fluorine-containing compounds during the pre-cleaning process. In other words, the illumination of the UV radiation during the pre-cleaning process efficiently degrades the fluorine-containing compounds, thus preventing from the formation of the hydrofluoric acid solution.

At operation 260. An integrating process is performed to the semiconductor structure so as to form a metal conducting channel 161 and a metal conducting via 163, as shown in FIG. 1E. In some embodiments, a second conducting metal is deposited into the channel 151 and the via 153 (as shown in FIG. 1D). In some embodiments, the second conducting metal includes a same material as a first conducting metal used to form the first metal conducting structure 110. In some embodiments, the second conducting metal includes a different material from the first conducting metal. In some embodiments, the second conducting metal includes copper, tungsten, silicide, other suitable conducting metal and/or a combination thereof.

In this embodiment, because the fluorine-containing compounds are degraded by the UV radiation during the pre-cleaning process (operation 240), the hydrofluoric acid solution is not formed in the surface pores of the interconnecting structures during the cleaning process (operation 250). Accordingly, the method 200 efficiently overcomes the low-k leakage defects induced by the fluorine-containing compounds, further preventing from the defects of carbon depletion during the integrating process (operation 260).

Referring to FIG. 2 together with FIG. 1C to FIG. 1E. In some embodiments, before the operation 250 is performed, the surface pores of the second channel 151 and the surface pores of the via 153 are further filled with a precursor. The precursor includes a low-k material used to deposit ILD layer 130. In some embodiments, the precursor includes a low-k silane-based material. In some embodiments, the low-k silane based material includes silicon oxide, silicon nitride, TEOS, other suitable low-k silane based materials and/or a combination thereof. During the filling process of the precursor, the precursor is deposited to fill the surface pores in the surface 151a and the surface pores in the surface 153a rather than forming a layer over the surface 151a and the surface 153a. In some embodiments, a thickness of the deposited precursor is substantially less than 10 Å. In this embodiment, the precursor further prevents the surface pores in the first surface 151a and in the surface 153a from the damage of the residual fluorine-containing compounds. If the deposited precursor formed a thin layer over the surface 151a and/or the surface 153a, a profile of the semiconductor structure is varied by the thin layer formed from the precursor.

After the precursor is filled into the surface pores of the second channel 151 and the via 153, the second conducting metal is deposited into the second channel 151 and the via 153 so as to form the metal conducting channel 161 and the metal conducting via 163 (i.e. operation 260).

Referring to FIG. 2 together with FIG. 1F and FIG. 1G. In some embodiments, an ESL 170 and an ILD layer 180 are further deposited over the ILD layer 130, the metal conducting channel 161 and the metal conducting via 163 after the operation 260 is performed. The ILD layer 180 is deposited on the ESL 170. In some embodiments, the ESL 170 and the ILD layer 180 are formed by the same processes as the ESL 120 and the ILD layer 130. In some embodiments, the ESL 170 and the ILD layer 180 are formed from the same material as the ESL 120 and the ILD layer 130. In some embodiments, the ESL 170 and the ILD layer 180 are formed from the different material from the ESL 120 and the ILD layer 130. In this embodiment, repeating the operations 230, 240, 250 and 260, the metal conducting channel 191 and the metal conducting channel 193 are formed in the ILD layer 180 and respectively connected to the metal conducting channel 161 and the metal conducting via 163. The metal conducting channel 191 and the metal conducting channel 193 are formed from a third conducting metal. In some embodiments, the third conducting metal includes a same material as the second conducting metal. In some embodiments, the third conducting metal includes a different material from the second conducting metal.

Figure 3:
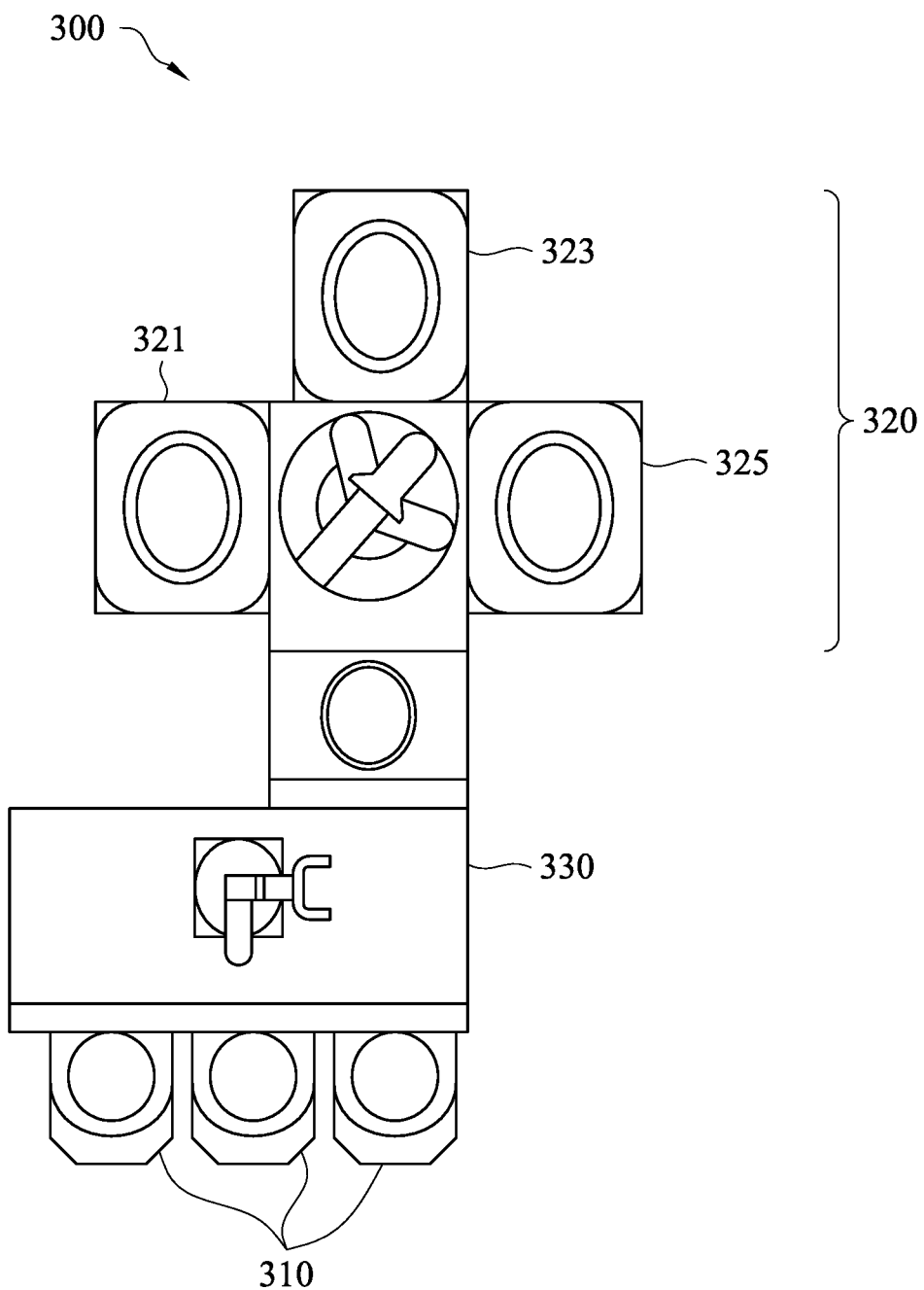
FIG. 3 is a schematic diagram of a system for fabricating a semiconductor device in accordance with some embodiments of the present disclosure.

Referring to FIG. 3. FIG. 3 is a schematic diagram of a system 300 for fabricating a semiconductor device in accordance with some embodiments of the present disclosure. The system 300 includes a loading apparatus 310, a processing apparatus 320 and a transferring apparatus 330. The transferring apparatus 330 is disposed between the processing apparatus 320 and the loading apparatus 310. The processing apparatus 320 may include an etching chamber 321, a pre-cleaning chamber 323 and a cleaning chamber 325. The etching chamber 321, the pre-cleaning chamber 323 and the cleaning chamber 325 are independently adjacent to the transferring apparatus 330. In some embodiments, the transferring apparatus 330 may include a transfer robot for transferring a semiconductor substrate from the loading apparatus 310 to the etching chamber 321, and then from the etching chamber 321 to the pre-cleaning chamber 323, and thereafter form the pre-cleaning chamber 323 to the cleaning chamber 315.

In some embodiments, the semiconductor substrate includes a low-k dielectric layer. The low-k dielectric layer is deposited over a metal conducting structure. In some embodiments, an ESL is disposed between the low-k dielectric layer and the metal conducting structure. In some embodiments, the metal conducting structure includes various interconnects, such as vias, contacts, pads, metal lines, other suitable interconnects and/or a combination thereof. The low-k dielectric layer is called as an ILD layer in some embodiments. The low-k dielectric layer is formed from a low-k material. In some embodiments, the low-k material includes a silane-based insulating material such as silicon oxide, silicon nitride, undoped silicate glass (USG), Boro-Silicate Glass (BSG), TEOS, other suitable low-k silane-based materials and/or a combination thereof.

The semiconductor substrate is subjected to an etching process while the semiconductor substrate is transferred into the etching chamber 321 by the transferring apparatus 330. The etching chamber 321 includes a plasma etching device. The plasma etching device includes a supplying inlet of a fluorine-containing gas. In some embodiments, the etching process is subjected on the low-k dielectric layer by using the fluorine-containing gas so as to form various interconnecting structures low-k dielectric layer. In some embodiments, the various interconnecting structures, such as openings, vias, contacts, pads, trenches, other suitable interconnecting structures and/or a combination thereof, are formed after the low-k dielectric layer is bombarded by the fluorine-containing gas. Fluorine-containing compounds are formed in plural surface pores of the interconnecting structures in some embodiments.

In the pre-cleaning chamber 323, the semiconductor substrate is subjected to a pre-cleaning process by illumination UV radiation so as to remove the fluorine-containing compounds. In this embodiment, the pre-cleaning chamber 323 includes an UV radiating device. In some embodiments, a wavelength of the UV radiation is in a range substantially from 200 nm to 250 nm. In some embodiments, the wavelength of the UV radiation covers an absorption wavelength of the fluorine-containing compounds, for example 200 nm to 250 nm. In some embodiments, the wavelength of the UV radiation covers an absorption wavelength of the chemical bonding Si—F. In some embodiments, an illuminating period of the UV radiation is substantially at least 30 seconds. In some embodiments, the illuminating period of the UV radiation is in a range substantially from 30 seconds to 120 seconds. In some embodiments, the illuminating period of the UV radiation is adjustable based on a content of the remaining fluorine-containing compounds formed during the etching process.

In some embodiments, the pre-cleaning chamber further includes a supplying inlet of a precursor. The precursor is supplied into the pre-cleaning chamber 323 after the illumination of the UV radiation is performed. In some embodiments, the precursor includes the low-k material used to deposit the low-k dielectric layer. In some embodiments, the precursor includes a low-k based material. In some embodiments, the low-k silane based material includes silicon oxide, silicon nitride, TEOS, other suitable low-k silane based materials and/or a combination thereof. The precursor is deposited to fill the surface pores formed in a surface of the various interconnecting structures during the etching process rather than depositing a layer over the surface of the various interconnecting structures. In some embodiments, a thickness of the deposited precursor is substantially less than 10 Å.

In the cleaning chamber 325, the semiconductor substrate is cleaned by a water-based solution. In some embodiments, the water-based solution includes deionized water. In this embodiment, the fluorine-containing compounds are removed in the pre-cleaning chamber by the UV radiation, such that the hydrofluoric acid solution does not form during the cleaning process. Thus, the surface pores in the surface of the interconnecting structures do not be enlarged during the cleaning process so as to prevent from having the low-k leakage defects.

After the semiconductor substrate is cleaned, the semiconductor substrate is transferred to the loading apparatus 310 form the cleaning chamber 325 by the transferring apparatus 330. The cleaned semiconductor substrate is then transferred to an integrating system so as to subject to the integrating process, thereby forming the metal conducting structure.

In some embodiments, the semiconductor substrate is transferred into the etching chamber 321 from the cleaning chamber 325 so as to be subjected to another etching process for forming anticipated profiles of the semiconductor device. In this embodiment, the semiconductor substrate is sequentially transferred to the pre-cleaning chamber 323 and the cleaning chamber 325 so as to subject to the pre-cleaning process and the cleaning process.

Figure 4:
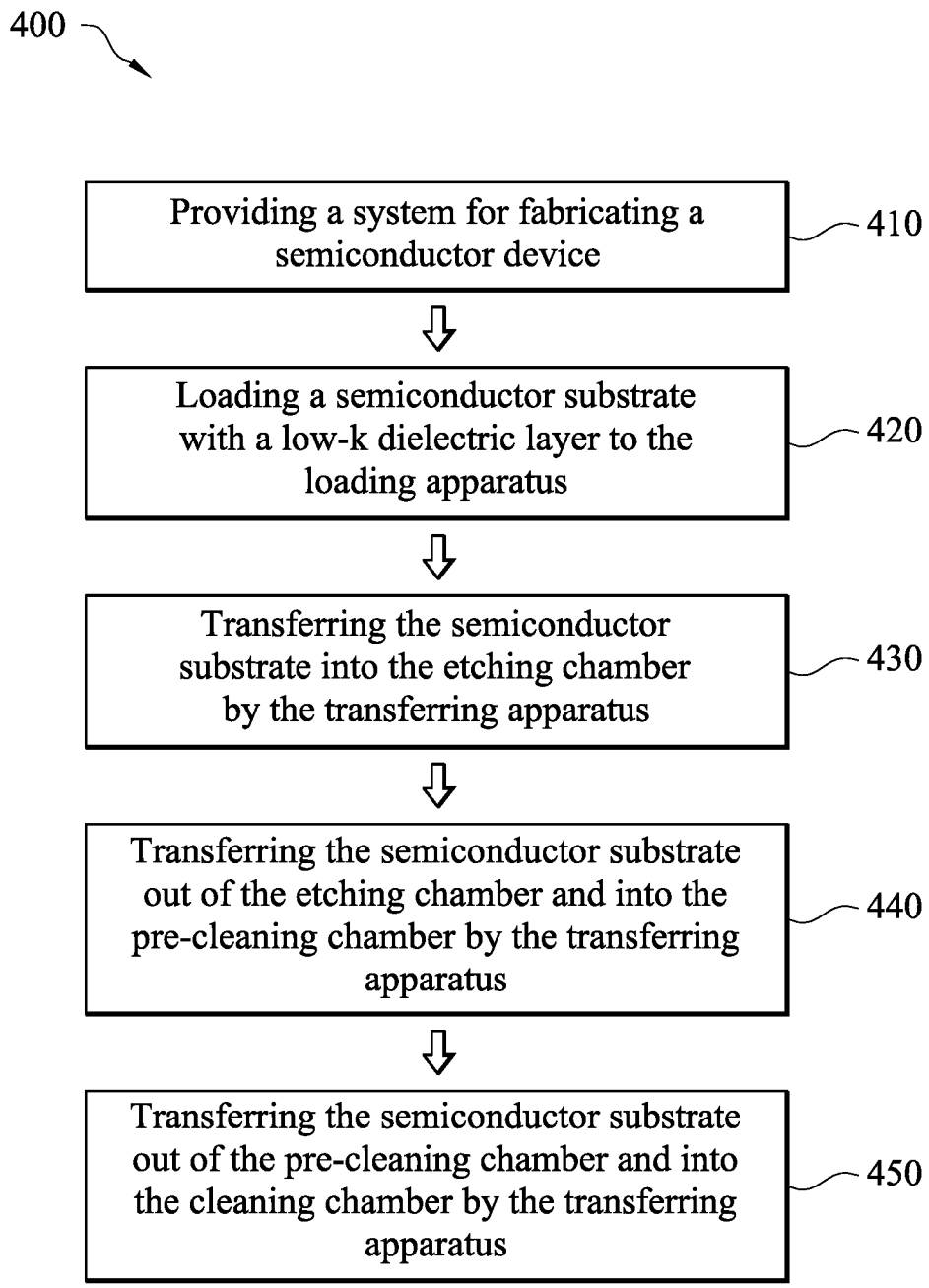
FIG. 4 is a flow chart showing a method for fabrication a semiconductor device according to certain embodiments of the present disclosure.

Referring to FIG. 4 together with FIG. 3. FIG. 4 is a flow chart showing a method 400 for fabrication a semiconductor device according to certain embodiments of the present disclosure. At operation 410, a system 300 for fabricating the semiconductor device is provided. In this embodiment, the system 300 includes a loading apparatus 310, a processing apparatus 320 and a transferring apparatus 330. The transferring apparatus 330 is disposed between the loading apparatus 310 and the processing apparatus 320. The processing apparatus 320 includes an etching chamber 321, a pre-cleaning chamber 323 and a cleaning chamber 325. The etching chamber 321, the pre-cleaning chamber 323 and the cleaning chamber 325 are independently adjacent to the transferring apparatus 330. The transferring apparatus 330 may include a transfer robot for transferring a semiconductor substrate from the loading apparatus 310 to the etching chamber 321, and then from the etching chamber 321 to the pre-cleaning chamber 323, and thereafter form the pre-cleaning chamber 323 to the cleaning chamber 315. In some embodiments, arrangements of the etching chamber 321, the pre-cleaning chamber 323 and the cleaning chamber 325 are adjustable. In some embodiments, the etching chamber 321, the pre-cleaning chamber 323 and the cleaning chamber 325 are combined into one processing apparatus 320.

Referring to FIG. 4 together with FIG. 3 and FIG. 1A. At operation 420. A semiconductor substrate having a structure 100 with a low-k ILD layer 130 is loaded to the loading apparatus 310. In some embodiments, the semiconductor substrate includes a metal conducting structure 110 and an ESL layer 120. The ESL layer 120 is deposited over the metal conducting structure 110, and an ILD layer 130 is deposited over the ESL layer 120. In some embodiments, the ILD layer 130 includes a silane-based insulating material such as silicon oxide, silicon nitride, undoped silicate glass (USG), Boro-Silicate Glass (BSG), TEOS, other suitable low-k silane-based materials and/or a combination thereof. In some embodiments, the ILD layer 130 is formed from the low-k material.

Referring to FIG. 4 together with FIG. 3 and FIG. 1B. The semiconductor substrate is transferred to the etching chamber 321 of the processing apparatus 320 from the loading apparatus 310 by the transferring apparatus 330 so as to be subjected an etching process on the ILD layer 130 at operation 430. In some embodiments, the etching chamber 321 includes a plasma etching device. During the etching process, the ILD layer 130 is bombarded by a fluorine-containing gas 141 so as to form interconnecting structures (i.e. a channel 151 and/or a via 153) in the ILD layer 130. In some embodiments, the interconnecting structures, such as openings, vias, contacts, pads, trenches, other suitable interconnecting structures and/or a combination thereof, are formed after the ILD layer 130 is bombarded by the fluorine-containing gas 141.

In some embodiments, plural surface pores are formed in a surface 151a of the channel 151 and in a surface 153a of the via 153 during the etching process. In this embodiment, fluorine-containing compounds are formed in the surface pores of the channel 151 and the via 153 during the etching process. In some embodiments, the fluorine-containing gas 141 includes $C_xF_{2x+2}$ ($1 \leq x \leq 3$), hydrogen fluoride gas, other suitable fluorine-containing gases and/or a combination thereof. For example, the fluorine-containing gas 141 includes $CF_4$, $C_4F_6$, $C_4F_8$, $CHF_3$, $CH_2F_2$, $CH_3F$ and/or a combination thereof.

Referring to FIG. 4 together with FIG. 3 and FIG. 1C. At operation 450. The etched semiconductor substrate is transferred out of the etching chamber 321 and into the pre-cleaning chamber 323 by the transferring apparatus 330. The semiconductor substrate is subjected to a pre-cleaning process by the illumination of UV radiation 143. The fluorine-containing compounds formed in the surface pores of the channel 151 and the via 153 are degraded by the UV radiation 143. In some embodiments, a wavelength of the UV radiation 143 is in a range substantially from 200 nm to 250 nm. In some embodiments, the wavelength of the UV radiation 143 covers an absorption wavelength of the fluorine-containing compounds. In some embodiments, the wavelength of the UV radiation 143 covers an absorption wavelength of the chemical bonding Si—F. In some embodiments, an illuminating period of the UV radiation 143 is substantially at least 30 seconds. In some embodiments, the illuminating period of the UV radiation 143 is in a range substantially from 30 seconds to 120 seconds. In some embodiments, the illuminating period of the UV radiation 143 is adjustable based on a content of the remaining fluorine in the surface pores of the second channel 151 and the via 153.

In some embodiments, the pre-cleaning chamber 323 further includes a supplying inlet of a precursor. In some embodiments, the precursor includes a low-k material used to deposit the low-k dielectric layer. In some embodiments, the low-k silane based material includes silicon oxide, silicon nitride, TEOS, other suitable low-k silane based materials and/or a combination thereof. In some embodiments, the precursor is supplied into the pre-cleaning chamber 323 by the supplying inlet so as to be deposited in the surface pores of the channel 151 and the via 153. In this embodiment, the precursor is filled into the surface pores rather than forming a layer over the surface 151a of the channel 151 and the surface 153a of the via 153. In some embodiments, a thickness of the deposited precursor is substantially less than 10 Å.

Referring to FIG. 4 together with FIG. 3 and FIG. 1D. At operation 460. The pre-cleaned semiconductor substrate is transferred out of the pre-cleaning chamber 323 and into the cleaning chamber 325 by the transferring apparatus 330 so as to be subjected to a cleaning process. In some embodiments, the semiconductor substrate is cleaned by a water-based solution during the cleaning process. In some embodiments, the water-based solution includes deionized water.

Referring to FIG. 4 together with FIG. 3, FIG. 1D and FIG. 1E. In some embodiments, the cleaned semiconductor substrate is transferred to the loading apparatus 310 from the cleaning chamber 325 by the transferring apparatus 330 after the operation 450 is performed. Further, the semiconductor substrate is transferred to an integrating system so as to be subjected to an integrating process. Conducting metal is deposited into the channel 151 and the via 153 so as to form a metal conducting channel 161 and a metal conducting via 163 during the integrating process. In some embodiments, the conducting metal includes copper, tungsten, silicide, other suitable conducting metal and/or a combination thereof.

Referring to FIG. 4 together with FIG. 3, FIG. 1F and FIG. 1G. In some embodiments, an ESL 170 and an ILD layer 180 are sequentially deposited over the ILD layer 130, the metal conducting channel 161 and the metal conducting via 163 after the integrating process is performed. Then, the semiconductor substrate with the ILD layer 180 is loaded to the loading apparatus 310 of the system 300. Repeating the operation 430 to operation 450, interconnecting structures are formed in the ILD layer 180. After the cleaning process is performed, the semiconductor substrate is transferred out of the cleaning chamber 325 and to the loading apparatus 310. Further, the cleaned semiconductor substrate is subjected to the integrating process, such that the conducting metal is deposited into the interconnecting structures so as to form metal conducting channels 191 and 193. The metal conducting channels 191 and 193 respectively connect to the metal conducting channel 161 and the metal conducting via 163.

Figure 5:
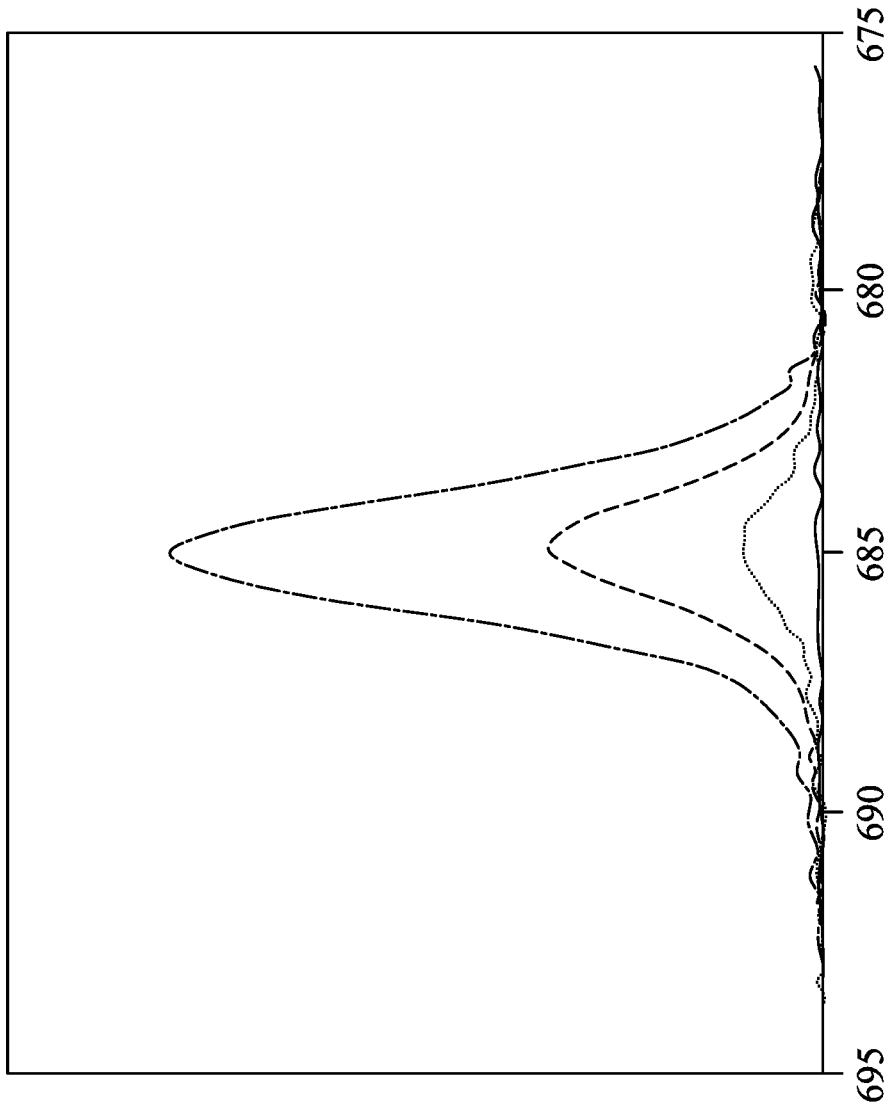
FIG. 5 is an X-ray photoelectron spectroscopy diagram showing the residual fluorine atoms before a cleaning process is performed in accordance with some embodiments of the present disclosure.

Referring to FIG. 5. FIG. 5 is an X-ray photoelectron spectroscopy diagram of the residual fluorine atoms before a cleaning process is performed in accordance with some embodiments of the present disclosure. Curve 501 represents the residual fluorine content in the ILD layer of the semiconductor substrate before the etching process is performed. Curve 502 represents the residual fluorine content in the ILD layer of the etched semiconductor substrate with the pre-cleaning of the UV radiation. Curve 503 represents the residual fluorine content in the ILD layer of the etched semiconductor substrate with the pre-cleaning of the UV radiation and the filling of the precursor. Curve 504 represents the etched semiconductor substrate without the pre-cleaning process. According to FIG. 5, the content of the fluorine is efficiently decreased by the illumination of the UV radiation. When the surface pores of the interconnecting structures is filled with the precursor, the precursor further covers and protects the surface of the surface pores in the interconnecting structures, thus preventing the fluorine-containing compounds from forming the hydrofluoric acid solution with the water-based solution during the following cleaning process. Accordingly, the method and the system of the present disclosure efficiently decrease the contents of the fluorine so as to overcome the low-k leakage defects, further preventing from having the defects of carbon depletion.

It can be understood that some embodiments of the present disclosure provide the method for fabricating a semiconductor device. The low-k leakage defects of the fluorine in the low-k dielectric layer are controlled by the operation of illuminating the UV radiation so as to prevent the fabricated semiconductor device from having the defect of carbon depletion during the integrating process. Further, it can be understood that some embodiments of the present disclosure provide the system for fabricating the semiconductor device. The etching chamber, the pre-cleaning chamber and the cleaning chamber are combined into one processing apparatus, thereby ensuring a better Q-time controlling and a higher through put.

It is noted that the method for fabricating the semiconductor device and the system using the same is not limited to the above embodiments of present disclosure. The method for fabricating the semiconductor device and the system using the same can applied in dry etching a low-k layer.

In accordance with an embodiment of the present disclosure, the present disclosure discloses a method for fabricating a semiconductor device. A semiconductor structure with a metal conducting structure is firstly provided, and a dielectric layer is deposited over the metal conducting structure. Next, an etching process is performed on the dielectric layer by using a fluorine-containing gas so as to form an opening. Fluorine-containing compounds are formed on a surface of the opening during the etching process. Then, a pre-cleaning process is performed by using UV radiation so as to remove the fluorine-containing compounds. And then, a cleaning process is performed to clean the surface of the opening after the pre-cleaning process is performed.

In accordance with another embodiment of the present disclosure, the present disclosure discloses a system for fabricating a semiconductor device. The system includes a loading apparatus, a processing apparatus and a transferring apparatus. The loading apparatus is configured to load a semiconductor substrate with a low-k dielectric layer. The processing apparatus includes an etching chamber, a pre-cleaning chamber and a cleaning chamber. The etching chamber is configured to perform an etching process to the semiconductor substrate. The pre-cleaning chamber is configured to perform a pre-cleaning process to the etched semiconductor substrate. The cleaning chamber is configured to perform a cleaning process to the pre-cleaned semiconductor substrate. The transferring apparatus is disposed between the loading apparatus and the processing apparatus. The transferring apparatus is configured to transfer the semiconductor substrate between the processing apparatus and the loading apparatus. The etching chamber, the pre-cleaning chamber and the cleaning chamber are independently adjacent to the transferring apparatus.

In accordance with another embodiment of the present disclosure, the present disclosure discloses a method for fabricating a semiconductor device. A system for fabricating the semiconductor device is firstly provided. The system includes a loading apparatus, a processing apparatus and a transferring apparatus. The loading apparatus is configured to load a substrate. The processing apparatus includes an etching chamber, a pre-cleaning chamber and a cleaning chamber. The etching chamber is configured to perform an etching process to the substrate. The pre-cleaning chamber is configured to perform a pre-cleaning process to the etched substrate. The cleaning chamber is configured to perform a cleaning process to the pre-cleaned substrate. The transferring apparatus is disposed between the loading apparatus and the processing apparatus. The transferring apparatus is configured to transfer the substrate between the processing apparatus and the loading apparatus. The etching chamber, the pre-cleaning chamber and the cleaning chamber are independently adjacent to the transferring apparatus. Next, a semiconductor substrate with a low-k dielectric layer is loaded to the loading apparatus. Then, the semiconductor substrate is transferred into the etching chamber by the transferring apparatus, thereby performing the etching process on the low-k dielectric layer of the semiconductor substrate by using a fluorine-containing gas so as to form an opening. Fluorine-containing compounds are formed on a surface of the opening during the etching process. Then, the etched semiconductor substrate is transferred out of the etching chamber and into the pre-cleaning chamber by the transferring apparatus, thereby performing the pre-cleaning process by using UV radiation so as to remove the fluorine-containing compounds. And then, the pre-cleaned semiconductor substrate is transferred out of the pre-cleaning chamber and into the cleaning chamber by the transferring apparatus, thereby performing the cleaning process to the surface of the opening with a water-based solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for fabricating a semiconductor device, wherein the method comprises:
   providing a semiconductor structure with a metal conducting structure;
   depositing a dielectric layer over the metal conducting structure;

performing an etching process on the dielectric layer by using a fluorine-containing gas so as to form first and second openings laterally separated from each other, a bottom surface of the first opening exposing the metal conducting structure, and a bottom surface of the second opening exposing the dielectric layer, wherein fluorine-containing compounds are formed in a plurality of surface pores of surfaces of the first and second openings during the etching process;

performing a pre-cleaning process by using UV radiation so as to remove the fluorine-containing compounds;

depositing a dielectric material to fill the surface pores of the surfaces of the first and second openings rather than forming a layer over the surfaces of the first and second openings, wherein the dielectric material and the dielectric layer comprises the same material; and performing a cleaning process to clean the surfaces of the first and second opening using a water-based solution after the pre-cleaning process is performed.

2. The method of claim 1, wherein the dielectric layer is formed from a low-k material.

3. The method of claim 1, wherein the UV radiation is illuminated for at least 30 seconds.

4. The method of claim 3, wherein a wavelength of the UV radiation is in a range substantially from 200 nm to 250 nm.

5. The method of claim 1, wherein depositing a dielectric material is performed prior to the cleaning process.

6. The method of claim 5, wherein the dielectric material includes a low-k material used to deposit the dielectric layer.

7. The method of claim 5, wherein the dielectric material includes a low-k silane-based material.

8. A method for fabricating a semiconductor device, wherein the method comprises:
providing a system for fabricating the semiconductor device, wherein the system comprises:
a loading apparatus configured to load a substrate;
a processing apparatus, including:
an etching chamber configured to perform an etching process to the substrate;
a pre-cleaning chamber configured to perform a pre-cleaning process to the substrate; and
a cleaning chamber configured to perform a cleaning process to the substrate; and
a transferring apparatus configured to transfer the substrate between the processing apparatus and the loading apparatus, wherein the transferring apparatus is disposed between the loading apparatus and the processing apparatus, and the etching chamber, the pre-cleaning chamber and the cleaning chamber are independently adjacent to the transferring apparatus;
loading a semiconductor substrate with a low-k dielectric layer to the loading apparatus;
transferring the semiconductor substrate into the etching chamber by the transferring apparatus, thereby performing the etching process on the low-k dielectric layer of the semiconductor substrate by using a fluorine-containing gas so as to form first and second openings separated from each other, a bottom surface of the first opening being connected to the semiconductor substrate, and a bottom surface of the second opening being separated from the semiconductor substrate by the low-k dielectric layer, wherein fluorine-containing compounds are formed in a plurality of surface pores on surfaces of the first and second openings during the etching process;

transferring the etched semiconductor substrate out of the etching chamber and into the pre-cleaning chamber by the transferring apparatus, thereby performing the pre-cleaning process by using UV radiation so as to remove the fluorine-containing compounds;

filling the surface pores of the openings with a low-k dielectric material rather than forming a layer over the surfaces of the first and second openings;

transferring the pre-cleaned semiconductor substrate out of the pre-cleaning chamber and into the cleaning chamber by the transferring apparatus; and performing the cleaning process to the surfaces of the first and second openings with a water-based solution, so as to remove the residue fluorine-containing compounds from the openings using the water-based solution.

9. The method of claim 8, wherein the UV radiation is illuminated for at least 30 seconds.

10. The method of claim 9, wherein a wavelength of the UV radiation is in a range substantially from 200 nm to 250 nm.

11. The method of claim 8, wherein after the pre-cleaning process is performed, the method further comprises:
filling a plurality of surface pores of the first and second openings with a dielectric material followed by the process of transferring the pre-cleaned semiconductor substrate out of the pre-cleaning chamber.

12. The method of claim 11, wherein the dielectric material includes a low-k material used to deposit the low-k dielectric layer.

13. The method of claim 11, wherein the dielectric material includes a low-k silane-based material.

14. A method for fabricating a semiconductor device, wherein the method comprises:
etching a first dielectric layer to form first and second openings in the first dielectric layer, wherein a bottom surface of the first opening is lower than a bottom surface of the first dielectric layer, and a bottom surface of the second opening is higher than a bottom surface of the first dielectric layer;
forming first and second metal conducting structures in the first and second openings, respectively;
depositing a second dielectric layer over the first and second metal conducting structures after forming the first and second metal conducting structures;
performing an etching process on the second dielectric layer by using a fluorine-containing gas so as to form third and fourth openings with a plurality of surface pores, wherein fluorine-containing compounds are formed on surfaces of the third and fourth openings during the etching process;
performing a pre-cleaning process, in a pre-cleaning chamber, by using UV radiation so as to remove the fluorine-containing compounds, wherein a wavelength of the UV radiation is substantially in a range of an absorption wavelength of the fluorine-containing compounds;
filling the plurality of surface pores, in the pre-cleaning chamber, with a silane-based dielectric material rather than forming a layer over the surfaces of the third and fourth openings after the fluorine-containing compounds are degraded by an illumination of the UV radiation; and
performing a cleaning process to clean the surfaces of the third and fourth openings after filling the plurality of surface pores with the dielectric material.

15. The method of claim 14, wherein the second dielectric layer is formed from a low-k material.

16. The method of claim 14, wherein the wavelength of the UV radiation is substantially in a range of an absorption wavelength of a chemical bonding Si—F of the fluorine-containing compounds.

17. The method of claim 14, wherein the dielectric material and the second dielectric layer are made of the same material.

18. The method of claim 14, wherein the dielectric material includes a low-k material.

19. The method of claim 14, wherein a thickness of the dielectric material is substantially less than 10 Å.

20. The method of claim 1, wherein the etching process is performed such that a plurality of pores are formed in a bottom surface of the opening and the fluorine-containing compounds are formed in the pores.

* * * * *